(12) United States Patent
Yin et al.

(10) Patent No.: US 11,315,515 B2
(45) Date of Patent: Apr. 26, 2022

(54) GOA CIRCUIT, DISPLAY PANEL, AND ELECTRONIC DEVICE

(71) Applicant: SHENZHEN ROYOLE TECHNOLOGIES CO., LTD., Guangdong (CN)

(72) Inventors: Xiang Yin, Guangdong (CN); Ji Ha Kim, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/129,165

(22) Filed: Dec. 21, 2020

(65) Prior Publication Data

US 2021/0193070 A1  Jun. 24, 2021

(30) Foreign Application Priority Data

Dec. 23, 2019  (CN) .................. 201911340139.X

(51) Int. Cl.
*G09G 3/36* (2006.01)
*H01L 27/12* (2006.01)

(52) U.S. Cl.
CPC ....... *G09G 3/3677* (2013.01); *H01L 27/1225* (2013.01)

(58) Field of Classification Search
CPC . G09G 3/3677; G09G 3/3674; H01L 27/1225
See application file for complete search history.

(56) References Cited

U.S. PATENT DOCUMENTS

2010/0201666 A1*  8/2010  Tobita .............. H01L 29/78666
                                                            345/208
2019/0129547 A1*  5/2019  Dai ....................... G06F 3/0416

FOREIGN PATENT DOCUMENTS

CN        108877626 A      11/2018
KR     20170080352 A       7/2017

OTHER PUBLICATIONS

The Extended European Search Report issued in corresponding EP Application No. EP 20216363.0, dated Apr. 22, 2021, pp. 1-13, European Patent Office, Munich, Germany.

* cited by examiner

*Primary Examiner* — Robert J Michaud
(74) *Attorney, Agent, or Firm* — JCIP Global Inc.

(57) ABSTRACT

A GOA circuit is provided according to implementations of the disclosure. The GOA circuit includes multiple cascaded GOA units. Each GOA unit includes a first pull-down control module, a second pull-down control module, and a pull-down holding module. A type of at least one thin film transistor (TFT) in at least one of the first pull-down control module or the second pull-down control module is different from that of a TFT in the pull-down holding module. A display panel and an electronic device are further provided according to implementations of the disclosure.

19 Claims, 8 Drawing Sheets

GOA CIRCUIT, DISPLAY PANEL, AND ELECTRONIC DEVICE

CROSS-REFERENCE TO RELATED APPLICATION(S)

This application claims priority to Chinese Application Patent Serial No. 201911340139X, filed on Dec. 23, 2019, the entire disclosure of which is hereby incorporated by reference.

TECHNICAL FIELD

This disclosure relates to the technical field of display driving, and particularly to a gate driver on array (GOA) circuit, a display panel, and an electronic device.

BACKGROUND

At present, row scan lines of an active matrix organic light emitting diode (AMOLED) display panel is driven by external integrated circuits (ICs). That is, the external ICs can control the progressive activation of the row scan lines. In contrast, by using the GOA method, row-scan driver circuits can be integrated on a substrate of the display panel, which can reduce the number of the external ICs, thus reducing production cost of the display panel and facilitating narrow frame design of the display device. Currently, thin film transistors (TFTs) used in the GOA circuit generally have the same type, for example, all the TFTs used in the GOA circuit are N-type TFTs or P-type TFTs, where the N-type TFTs are low temperature poly-silicon (LTPS) TFTs or N-type metal oxide TFTs. When the TFTs in the GOA circuit are all N-type LTPS-TFTs, leakage current is large, which may cause that a refresh rate cannot be reduced when pixel units performs image display, such that overall power consumption of the display panel is large. In addition, when the TFTs in the GOA circuit are all N-type metal oxide TFTs, shift easily occurs, which may cause that different pixel units display same image data in display brightness values not completely the same, such that the image data cannot be uniformly displayed. Furthermore, the existing GOA circuit generally adopts one pull-down control module to control a signal at a voltage node. Generally, the signal at the voltage node is a high-level signal or a low-level signal. It is not good to adopt one pull-down control module to control the signal at the voltage node to be the high-level signal or the low-level signal.

SUMMARY

In view of the above, implementations of the disclosure provides a gate driver on array (GOA) circuit having a good display effect. The specific technical solution is as follows.

A GOA circuit is provided. The GOA circuit includes multiple cascaded GOA units.

Each of the multiple GOA units includes a first pull-down control module, a second pull-down control module, and a pull-down holding module. The GOA unit further includes a first voltage terminal, a clock signal terminal, and a control signal terminal that are configured to provide signals. A scanning period of the GOA unit includes a pull-up phase and a pull-down phase.

The first pull-down control module is coupled to the clock signal terminal, and is configured to output a signal from the clock signal terminal to a pull-down node in the pull-down phase.

The second pull-down control module is coupled to the first voltage terminal, and is configured to output a signal from the first voltage terminal to the pull-down node in the pull-up phase.

The pull-down holding module is coupled to the first pull-down control module and the second pull-down control module, and is configured to output, in the pull-down phase, the signal from the first voltage terminal to an output terminal according to the signal at the pull-down node, and to stop outputting, in the pull-up phase, the signal from the first voltage terminal to the output terminal according to the signal at the pull-down node.

A type of at least one thin film transistor (TFT) in at least one of the first pull-down control module or the second pull-down control module is different from that of a TFT in the pull-down holding module.

Implementations of the disclosure further provide a display panel. The display panel includes the GOA circuit described above.

Implementations of the disclosure further provide an electronic device. The electronic device includes the GOA circuit described above or the display panel described above.

The disclosure has the following technical advantages. On one hand, with aid of the first pull-down control module and the second pull-down control module, in the pull-down phase H4 the signal at the pull-down node can be controlled to be a potential signal different from that in the pull-up phase, which can control the accuracy of the signal at the pull-down node, thereby improving control accuracy of the GOA circuit. On the other hand, since the type of the at least one TFT in at least one of the first pull-down control module or the second pull-down control module is different from that of the TFT in the pull-down holding module, the waveform of the signal output from the GOA circuit may be accurate.

DETAILED DESCRIPTION

The following are some implementations of the disclosure. It should be noted that for those of ordinary skill in the art, various improvements and modifications can be made without departing from the principle of the disclosure, and these improvements and modifications also fall within the protection scope of the disclosure.

Figure 1:
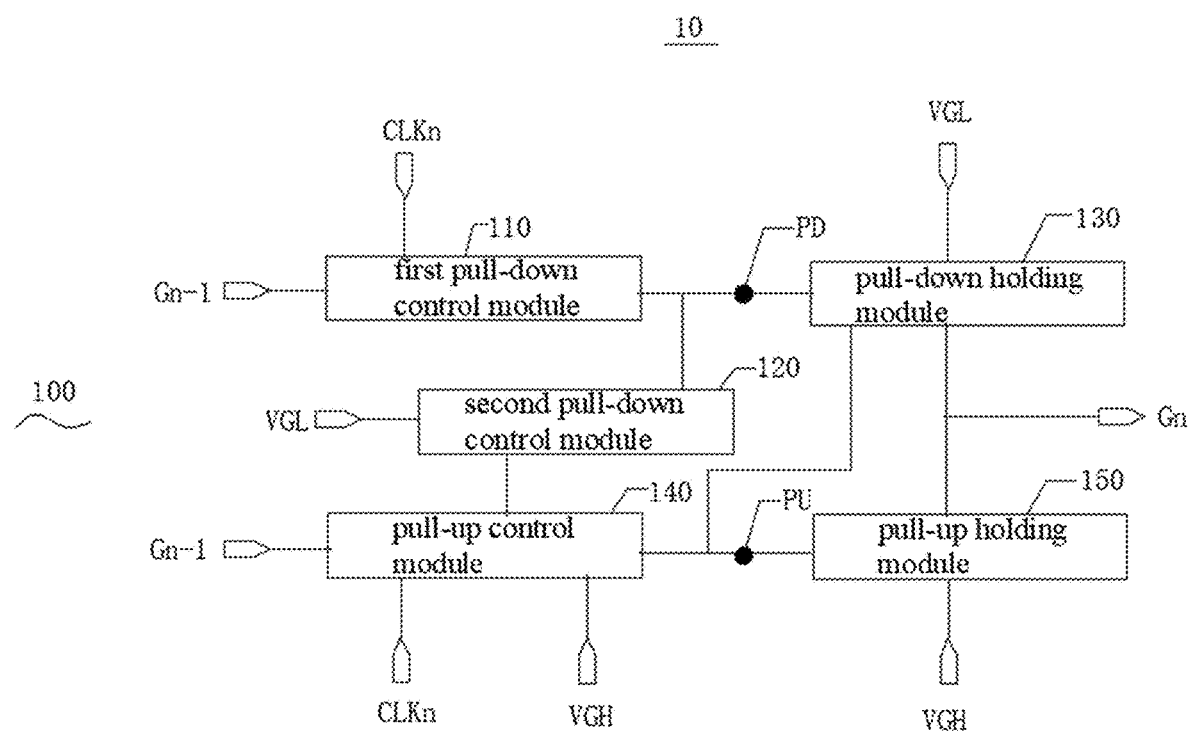
FIG. 1 is a structure block diagram illustrating a GOA circuit according to implementations of the disclosure.
Figure 2:
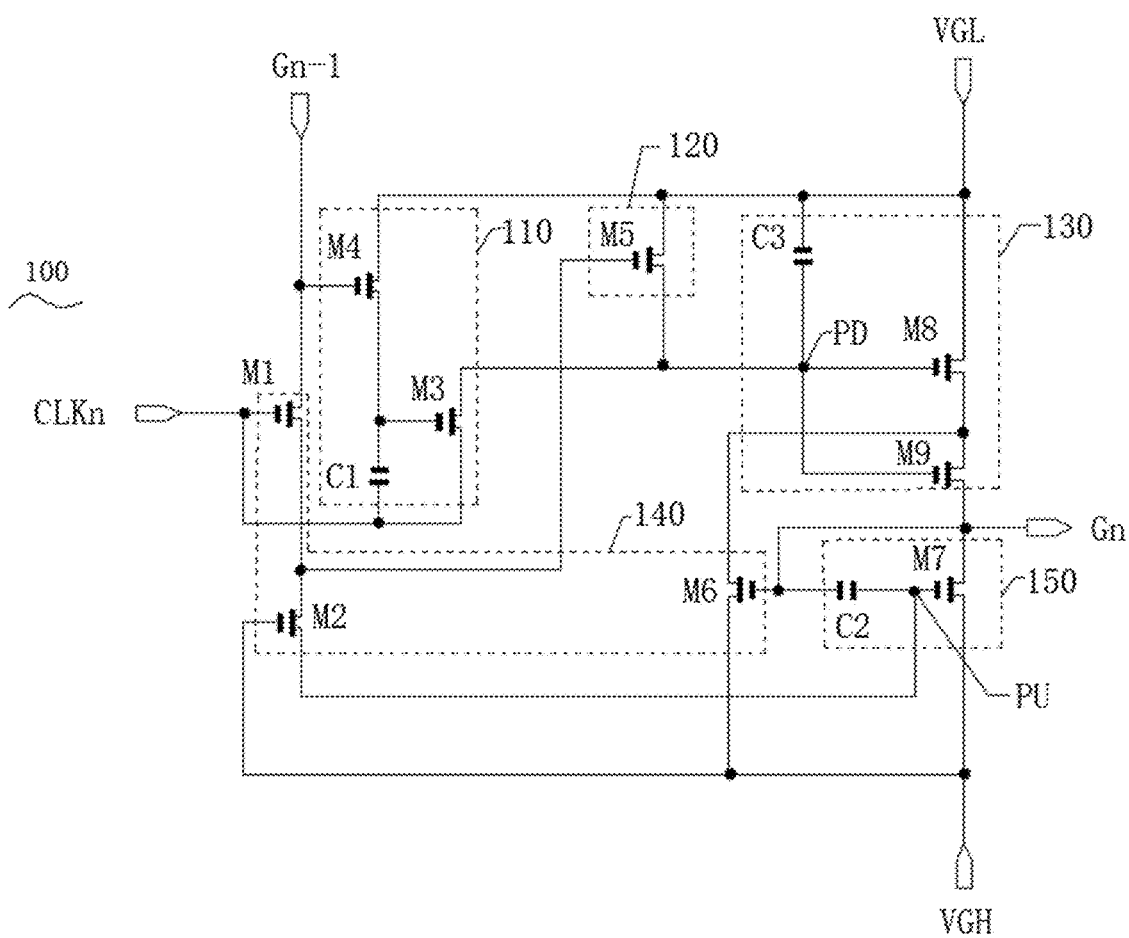
FIG. 2 is a schematic structural diagram illustrating a GOA circuit according to implementations of the disclosure.
Figure 3:
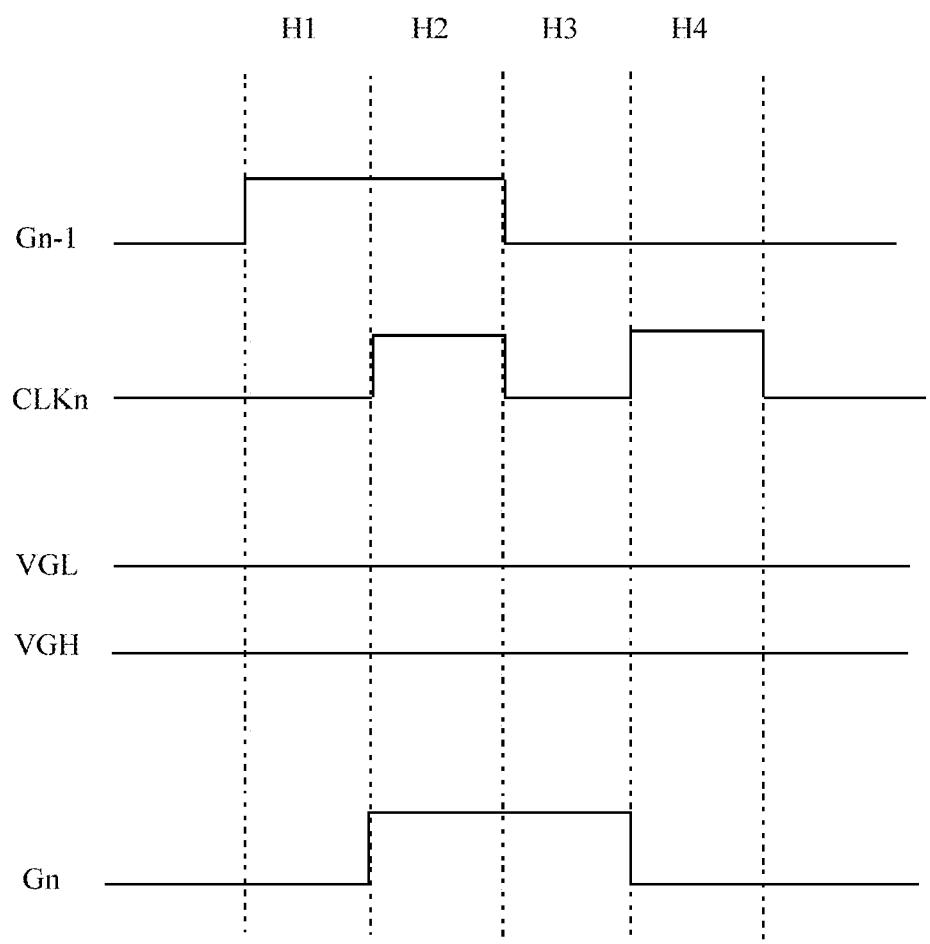
FIG. 3 is a signal waveform diagram according to implementations of the disclosure.

As illustrated in FIG. 1 and FIG. 2, a GOA circuit 10 is provided according to implementations of the disclosure. The GOA circuit 10 includes multiple cascaded GOA units 100. Each GOA unit 100 includes a first pull-down control module 110, a second pull-down control module 120, and a pull-down holding module 130. The GOA unit 100 further includes a first voltage terminal VGL, a clock signal terminal CLKn, and a control signal terminal Gn−1 that are configured to provide signals. A scanning period of the GOA unit 100 includes a pull-up phase H2 and a pull-down phase H4 (as illustrated in FIG. 3).

The first pull-down control module 110 is coupled to the clock signal terminal CLKn, and is configured to output a signal from the clock signal terminal CLKn to a pull-down node PD in the pull-down phase H4.

The second pull-down control module 120 is coupled to the first voltage terminal VGL, and is configured to output a signal from the first voltage terminal VGL to the pull-down node PD in the pull-up phase H2.

The pull-down holding module 130 is coupled to the first pull-down control module 110 and the second pull-down control module 120. The pull-down holding module 130 is configured to output, in the pull-down phase H4, the signal from the first voltage terminal VGL to an output terminal Gn according to the signal at the pull-down node PD, and to stop outputting, in the pull-up phase H2, the signal from the first voltage terminal VGL to the output terminal Gn according to the signal at the pull-down node PD.

A type of at least one thin film transistor (TFT) in at least one of the first pull-down control module 110 or the second pull-down control module 120 is different from that of a TFT in the pull-down holding module 130.

According to implementations, the first pull-down control module 110 and the second pull-down control module 120 can both control the signal at the pull-down node PD. According to the signal at the pull-down node PD, the signal from the first voltage terminal VGL can be controlled to be outputted to the output terminal Gn in the pull-down phase H4, or the signal from the first voltage terminal VGL can be controlled to be not outputted to the output terminal Gn in the pull-up phase H2. That is, with aid of the first pull-down control module 110 and the second pull-down control module 120, in the pull-down phase H4 the signal at the pull-down node PD is controlled to be a potential signal different from that in the pull-up phase H2, such that the signal at the pull-down node PD can be accurately controlled in different phases, thereby improving control accuracy of the GOA circuit.

According to implementations, the type of at least one TFT in at least one of the first pull-down control module 110 or the second pull-down control module 120 is different from that of the TFT in the pull-down holding module 130. The existing GOA circuit generally adopts N-type LTPS-TFTs or P-type LTPS-TFTs. However, the N-type LTPS-TFT has a relatively larger leakage current. A waveform of the signal output from the output terminal in the GOA circuit may have a serious distortion as the leakage current increases or the outputting of the signal output from the output terminal may even be started or ended ahead of time as the leakage current increases, thereby resulting in abnormal display. Therefore, in the implementation, the at least one TFT in at least one of the first pull-down control module 110 or the second pull-down control module 120 is the N-type metal oxide TFT, and the TFT in the pull-down holding module 130 is the N-type LTPS-TFT.

Generally, the N-type metal oxide TFT has a lower leakage current than the N-type LTPS-TFT. The leakage current refers to a drain current corresponding to a voltage (called Vds) between the drain and the source when negative shift of a voltage (called Vgs) between the gate and the source is in the range of 5-10V by taking the threshold voltage (Vth) as a reference voltage. Since the leakage current of the N-type metal oxide TFT is relatively low, the first pull-down control module 110 and the second pull-down control module 120 that are coupled to the pull-down node PD do not affect the voltage signal at the pull-down node PD, which can make the voltage signal at the pull-down node PD be relatively stable, such that the waveform of the signal output from the output terminal Gn in the GOA circuit is not affected.

In another implementation, under condition that the at least one TFT in at least one of the first pull-down control module 110 or the second pull-down control module 120 is the N-type metal oxide TFT, the TFT in the pull-down holding module 130 may also be the P-type TFT. The P-type TFT can accurately receive the voltage signal having a fixed value from the first voltage terminal VGL and has a large driving current, which makes the waveform of the signal output from the output terminal Gn be relatively accurate. In short, by means of setting the type of the at least one TFT in at least one of the first pull-down control module 110 or the second pull-down control module 120 to be different from that of the TFT in the pull-down holding module 130, the waveform of the signal output from the GOA circuit is made to be relatively accurate.

In addition, during low-frequency driving, since the leakage current of the N-type metal oxide TFT is relatively low, the stability of the voltage signal at the node coupled to the N-type metal oxide TFT is not affected. Generally, when the low-frequency driving is adopted or the driving frequency is relatively low, the voltage signal at the node coupled to the TFT needs to be maintained for a long time, if the leakage current of the TFT is relatively large, a part of the current corresponding to the voltage signal at the node may leak from the TFT. The longer a duration that the voltage signal at the node needs to be maintained, the more the current leaked, which causes the voltage signal at the node to be unstable, thereby causing other voltage output controlled by the voltage signal at the node to be unstable and reducing display quality of the display panel. Therefore, during low-frequency driving, using the N-type metal oxide TFT having the relatively low leakage current can reduce the influence generated by the leakage current, such that the N-type metal oxide TFT can be applied to a display panel driven at a low frequency, a display panel driven at both a low frequency and high frequency, or a display panel with a relatively wide frequency range and driven at a low frequency (for example, the N-type metal oxide TFT can be applied to a display panel with a frequency range of 1 Hz-120 Hz (also known as a display panel with a refresh rate of 1 Hz-120 Hz)).

In one example, the refresh rate of the GOA circuit ranges from 1 Hz to 120 Hz. The refresh rate refers to a minimal period that the control signal repeats. According to implementations, the refresh rate may be a minimal period that the control signal from the control signal terminal repeats, or a minimal period that the clock signal from the clock signal terminal repeats. In one example, the refresh rate of the GOA circuit ranges from 1 Hz to 30 Hz, 30 Hz to 60 Hz, 30 Hz to 90 Hz, 90 Hz to 120 Hz, 1 Hz to 60 Hz, or 60 Hz to 120 Hz.

In at least one implementation, in a case that the output terminal Gn of the GOA circuit continuously outputs signals, if the frequency of the signal from the control signal terminal Gn−1 is changed, the refresh rate of the GOA circuit is dynamically changed. In other words, the refresh rate of the GOA circuit can be dynamically adjusted within the frequency range of 1 Hz-120 Hz, and the waveform of the signal output from the GOA circuit is not affected when the refresh rate is dynamically changed.

In at least one implementation, a channel layer of the N-type metal oxide TFT is made from at least one material selected from a group consisting of indium gallium zinc oxide, gallium zinc oxide, indium zinc oxide, indium gallium tin oxide, and indium tin oxide.

In at least one implementation, a leakage current of the at least one TFT in at least one of the first pull-down control module or the second pull-down control module is less than $10^{-12}$ A. In one example, the channel layer of the N-type metal oxide TFT is made from a metal oxide material which can make the leakage current of the TFT be less than $10^{-12}$ A, to further reduce the influence of the leakage current on the GOA circuit. For example, the channel layer of the N-type metal oxide TFT is made from at least one material selected from a group consisting of indium gallium zinc oxide, gallium zinc oxide, indium zinc oxide, indium gallium tin oxide, and indium tin oxide.

Referring back to FIG. 2, in at least one implementation, the first pull-down control module 110 includes a fourth TFT M4, a third TFT M3, and a first capacitor C1. The fourth TFT M4 has a gate coupled to the control signal terminal Gn−1, a first electrode coupled to the first voltage terminal VGL, and a second electrode coupled to a first end of the first capacitor C1 and a gate of the third TFT M3. The first capacitor C1 has a second end coupled to a second electrode of the third TFT M3 and the clock signal terminal CLKn. The third TFT M3 has a first electrode coupled to the pull-down node PD.

Figure 7:
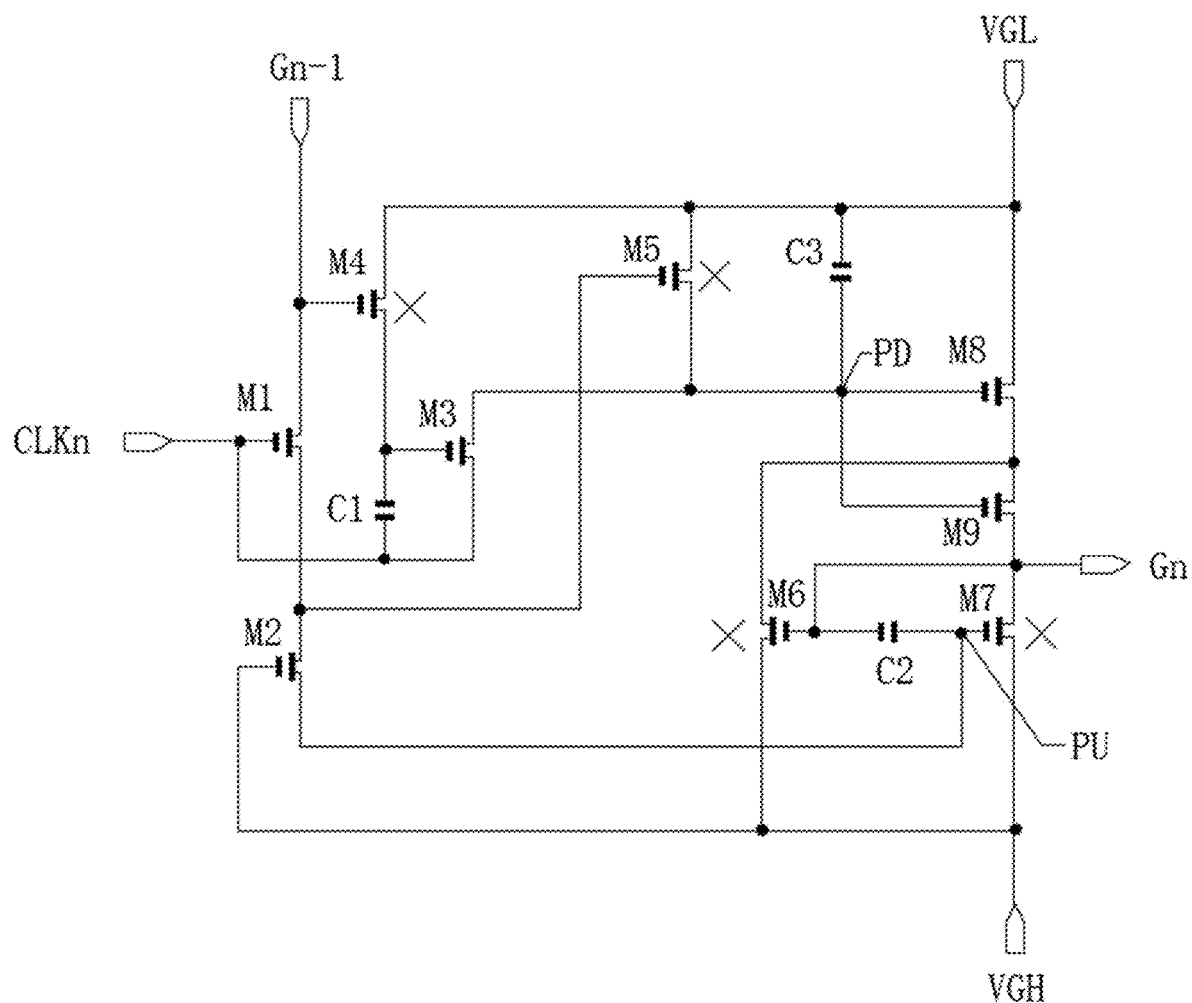
FIG. 7 is a schematic structural diagram illustrating a GOA circuit in a pull-down phase according to implementations of the disclosure.

As illustrated in FIG. 3 and FIG. 7, in the pull-down phase H4, the control signal terminal Gn−1 receives an input of a first control signal, and the clock signal terminal CLKn receives an input of a first clock signal, where the first control signal is configured to control the fourth TFT M4 to be switched off, and the first capacitor C1 transmits the first clock signal from the clock signal terminal CLKn to the gate of the third TFT M3 to control the third TFT M3 to be switched on, and transmits the first clock signal from the clock signal terminal CLKn to the pull-down node PD via the third TFT M3.

In at least one implementation, at least one of the fourth TFT M4 or the third TFT M3 is an N-type metal oxide TFT. The leakage current of the N-type metal oxide TFT is relatively low. The third TFT M3 is coupled to the pull-down node PD. If the leakage current of the third TFT M3 is relatively low, the third TFT M3 has a relatively small influence on the pull-down node PD. The fourth TFT M4 is electrically coupled to the gate of the third TFT M3. If the leakage current of the fourth TFT M4 is relatively large, the fourth TFT M4 may affect the stability of the on or off state of the third TFT M3, thereby causing the voltage signal transmitted to the pull-down node PD via the third TFT M3 to be unstable. Therefore, in the implementation, the third TFT M3 is an N-type metal oxide TFT, or the third TFT M3 and the fourth TFT M4 are both N-type metal oxide TFTs.

In at least one implementation, the second pull-down control module 120 includes a fifth TFT M5. The fifth TFT M5 has a gate coupled to the control signal terminal Gn−1, a first electrode coupled to the first voltage terminal VGL, and a second electrode coupled to the pull-down node PD. In one example, the gate of the fifth TFT M5 is coupled to the control signal terminal Gn−1 via a pull-up control module 140.

Figure 5:
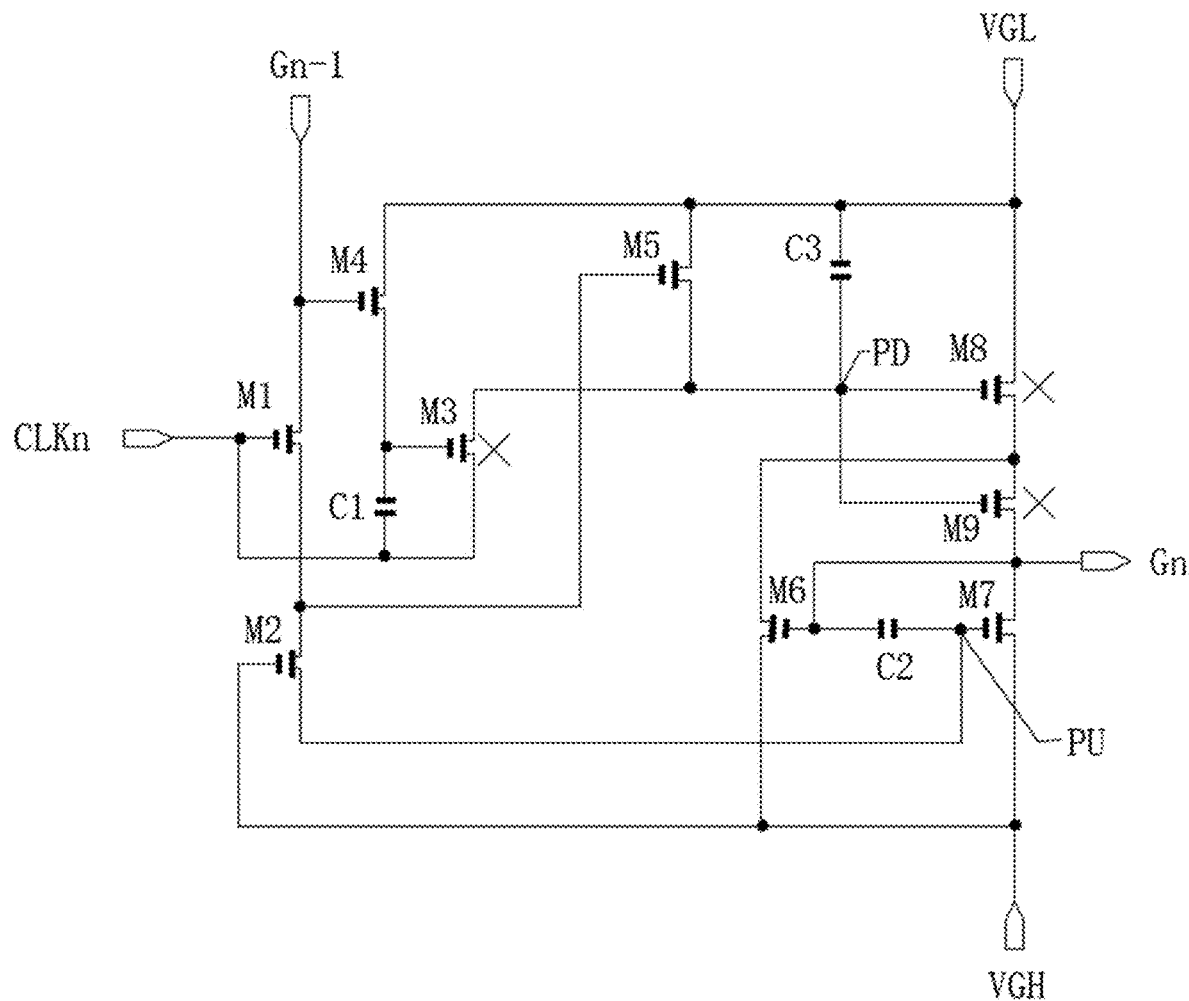
FIG. 5 is a schematic structural diagram illustrating a GOA circuit in a pull-up phase according to implementations of the disclosure.

As illustrated in FIG. 5, in the pull-up phase H2, the control signal terminal Gn−1 receives an input of a second control signal, and the fifth TFT M5 is controlled to be switched on according to the second control signal from the control signal terminal Gn−1 to transmit the signal from the first voltage terminal VGL to the pull-down node PD.

In at least one implementation, the fifth TFT M5 is an N-type metal oxide TFT. The leakage current of the N-type metal oxide TFT is relatively low. The second electrode of the fifth TFT M5 is coupled to the pull-down node PD. Since the leakage current of the fifth TFT M5 is relatively low, the fifth TFT M5 has a relatively small influence on the pull-down node PD. In one example, the fifth TFT M5 is an N-type metal oxide TFT having the leakage current that is less than $10^{-12}$ A, to further reduce the influence of the leakage current on the GOA circuit. Furthermore, the channel layer of the N-type metal oxide TFT is made from at least one material selected from a group consisting of indium gallium zinc oxide, gallium zinc oxide, indium zinc oxide, indium gallium tin oxide, and indium tin oxide.

Referring back to FIG. 2, in at least one implementation, the pull-down holding module 130 includes an eighth TFT M8, a ninth TFT M9, and a third capacitor C3. The pull-down node PD is coupled to a gate of the eighth TFT M8, a gate of the ninth TFT M9, and a second end of the third capacitor C3. The eighth TFT M8 has a first electrode coupled to the first voltage terminal VGL and a second electrode coupled to a first electrode of the ninth TFT M9. The ninth TFT M9 has a second electrode coupled to the output terminal Gn. The third capacitor C3 has a first end coupled to the first voltage terminal VGL.

As illustrated in FIG. 7, in the pull-down phase H4, the signal at the pull-down node PD is used for controlling the eighth TFT M8 and the ninth TFT M9 to be switched on, to enable the signal from the first voltage terminal VGL to be transmitted to the output terminal Gn via the eighth TFT M8 and the ninth TFT M9.

As illustrated in FIG. 5, in the pull-up phase H2, the signal at the pull-down node PD is used for controlling the eighth TFT M8 and the ninth TFT M9 to be switched off, to disenable the signal from the first voltage terminal VGL to be transmitted to the output terminal Gn.

In at least one implementation, the eighth TFT M8 and the ninth TFT M9 are both P-type TFTs or N-type TFTs, where the N-type TFT is an N-type metal oxide TFT and the P-type TFT is a P-type low temperature polycrystalline oxide TFT.

In one implementation, under condition that the eighth TFT M8 and the ninth TFT M9 are both N-type TFTs, the eighth TFT M8 and the ninth TFT M9 are both in an on state when the signal at the pull-down node PD is a high-level signal, to transmit the signal from the first voltage terminal VGL to the output terminal Gn.

In another implementation, under condition that the eighth TFT M8 and the ninth TFT M9 are both P-type TFTs, the eighth TFT M8 and the ninth TFT M9 are both in an on state when the signal at the pull-down node PD is a low-level signal, to transmit the signal from the first voltage terminal VGL to the output terminal Gn.

According to implementations, the pull-down holding module 130 is configured to transmit the signal from the first voltage terminal VGL to the output terminal Gn under the control of the pull-down node PD. Therefore, both of the eighth TFT M8 and the ninth TFT M9 can adopt TFTs with a strong charging capability or a small resistance value. In one example, the eighth TFT M8 and the ninth TFT M9 are both N-type LTPS-TFTs since the LTPS-TFT has a strong charging capability and can quickly transmit the signal from the first voltage terminal VGL to the output terminal Gn.

Referring back to FIG. 2, in at least one implementation, the GOA unit 10 further includes the pull-up control module 140, a pull-up holding module 150, and a second voltage terminal VGH. The pull-up control module 140 is coupled to the control signal terminal Gn−1, and is configured to output a signal from the control signal terminal Gn−1 to a pull-up node PU in the pull-up phase H2 or the pull-down phase H4. The pull-up holding module 150 is coupled to the pull-up control module 140, and is configured to output, in the pull-up phase H2, a signal from the second voltage terminal VGH to the output terminal Gn according to the signal at the pull-up node PU, and to stop outputting, in the pull-down phase H4, the signal from the second voltage terminal VGH to the output terminal Gn according to the signal at the pull-up node PU.

In at least one implementation, the pull-up control module 140 includes a first TFT M1 and a second TFT M2. The first TFT M1 has a gate coupled to the clock signal terminal CLKn, a first electrode coupled to the control signal terminal Gn−1, and a second electrode coupled to a first electrode of the second TFT M2. The second TFT M2 has a gate coupled to the second voltage terminal VGH and a second electrode coupled to the pull-up node PU. In one example, the first electrode of the second TFT M2 is further coupled to the gate of the fifth TFT M5 in the second pull-down control module 120. The fifth TFT M5 is coupled to the control signal terminal Gn−1 via the second TFT M2.

As illustrated in FIG. 5, in the pull-up phase H2, the control signal terminal Gn−1 receives an input of a second control signal, and the clock signal terminal CLKn receives an input of a first clock signal, where the first clock signal is used for controlling the first TFT M1 to be switched on, and the signal from the second voltage terminal VGH is used for controlling the second TFT M2 to be switched on, to enable the second control signal to be transmitted to the pull-up node PU via the first TFT M1 and the second TFT M2.

As illustrated in FIG. 7, in the pull-down phase H4, the control signal terminal Gn−1 receives an input of a first control signal, and the clock signal terminal CLKn receives the input of the first clock signal, where the first clock signal is used for controlling the first TFT M1 to be switched on, and the signal from the second voltage terminal VGH is used for controlling the second TFT M2 to be switched on, to enable the first control signal to be transmitted to the pull-up node PU via the first TFT M1 and the second TFT M2.

In at least one implementation, the first TFT M1 is an N-type metal oxide TFT. As illustrated in FIG. 2, the pull-up node PU is coupled to the control signal terminal Gn−1 via the first TFT M1. In a case that the signal from the control signal terminal Gn−1 is a low-level signal and the signal at the pull-up node PU is a high-level signal, if the leakage current of the first TFT M1 is relatively large, the high-level signal at the pull-up node PU may be pulled down by the first TFT M1, so that the level of the signal at the pull-up node PU cannot be maintained effectively. Therefore, in the implementation, the first TFT M1 is an N-type metal oxide TFT. Alternatively, the first TFT M1 is an N-type metal oxide TFT having the leakage current that is less than $10^{-12}$ A, to further reduce the influence of the leakage current on the GOA circuit. Furthermore, the channel layer of the N-type metal oxide TFT is made from at least one material selected from a group consisting of indium gallium zinc oxide, gallium zinc oxide, indium zinc oxide, indium gallium tin oxide, and indium tin oxide.

In at least one implementation, the pull-up control module 140 further includes a sixth TFT M6. The sixth TFT M6 has a gate coupled to the output terminal Gn, a first electrode coupled to the second voltage terminal VGH, and a second electrode coupled to the pull-down holding module 130. In one example, the second electrode of the sixth TFT M6 is coupled to the second electrode of the eighth TFT M8 in the pull-down holding module 130.

In at least one implementation, the pull-up holding module 150 includes a seventh TFT M7 and a second capacitor C2. The seventh TFT M7 has a gate coupled to the pull-up node PU and a first end of the second capacitor C2, a first electrode coupled to the output terminal Gn, and a second electrode coupled to the second voltage terminal VGH. The second capacitor C2 has a second end coupled to the output terminal Gn.

In the pull-up phase H2, the signal at the pull-up node PU is used for controlling the seventh TFT M7 to be switched on, to enable the signal from the second voltage terminal VGH to be transmitted to the output terminal Gn via the seventh TFT M7.

In the pull-down phase H4, the signal at the pull-up node PU is used for controlling the seventh TFT M7 to be switched off, to disenable the signal from the second voltage terminal VGH to be transmitted to the output terminal Gn.

In at least one implementation, the seventh TFT M7 is a P-type TFT or an N-type TFT, where the N-type TFT is an N-type metal oxide TFT and the P-type TFT is a P-type low temperature polycrystalline oxide TFT.

In one implementation, under condition that the seventh TFT M7 is an N-type TFT, the seventh TFT M7 is in an on state when the signal at the pull-up node PU is a high-level signal, to transmit the signal from the second voltage terminal VGH to the output terminal Gn.

In another implementation, under condition that the seventh TFT M7 is a P-type TFT, the seventh TFT M7 is in an on state when the signal at the pull-up node PU is a low-level signal, to transmit the signal from the second voltage terminal VGH to the output terminal Gn.

In one example, the pull-up holding module 150 is configured to transmit the signal from the second voltage terminal VGH to the output terminal Gn under the control of the pull-up node PU. Therefore, it is better to use a TFT with a strong charging capability or a small resistance value as the seventh TFT M7, and there is no need to adopt the N-type metal oxide TFT. The seventh TFT M7 may be an N-type LTPS-TFT since the LTPS-TFT has a strong charging capability and can quickly transmit the signal from the second voltage terminal VGH to the output terminal Gn.

It can be understood that a mirror circuit corresponding to the GOA circuit of the disclosure also falls within the protection scope of the disclosure. According to the implementations of the disclosure, those skilled in the art can obtain the mirror circuit corresponding to the GOA circuit, for example, when polarities of all the electronic components in FIG. 2 are changed, the mirror circuit corresponding to the GOA circuit can be obtained.

The following describes the specific working timing of the GOA unit with reference to the signal waveform illustrated in FIG. 3 in combination with the GOA circuit illustrated in FIG. 4 to FIG. 7. As illustrated in FIG. 3, a scanning period of the GOA unit includes a pull-down holding phase H1, a pull-up phase H2, a pull-up holding phase H3, and a pull-down phase H4 that are adjacent to each other in time. The pull-down holding phase H1 of the later scanning period is adjacent to the pull-down phase H4 of the previous scanning period. It should be noted that, compared with the signal waveform illustrated in FIG. 3, in other time intervals, periods of signal waveforms can shift forward or backward by one or more phases.

Figure 4:
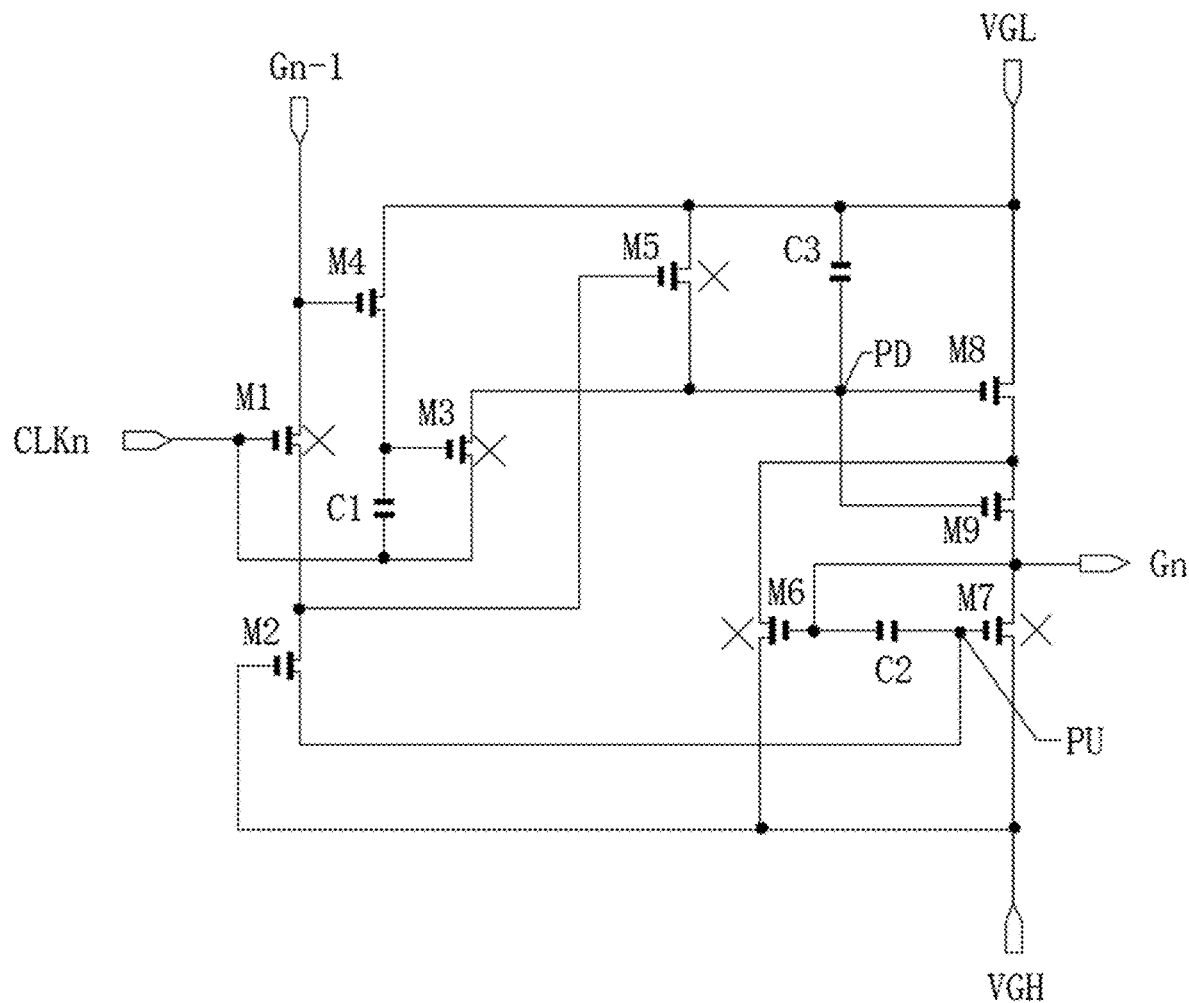
FIG. 4 is a schematic structural diagram illustrating a GOA circuit in a pull-down holding phase according to implementations of the disclosure.

As illustrated in FIG. 3 and FIG. 4, in the pull-down holding phase H1, the control signal terminal Gn−1 receives an input of a second control signal of high-level, the clock signal terminal CLKn receives an input of a second clock signal of low-level, the signal from the first voltage terminal VGL is a low-level signal, and the signal from the second voltage terminal VGH is a high-level signal.

In this case, the first TFT M1 is controlled to be switched off, and the fourth TFT M4 is controlled to be switched on to enable the low-level signal from the first voltage terminal VGL to be transmitted to the gate of the third TFT M3 via the fourth TFT M4, to make the third TFT M3 be switched off.

The pull-up node PU is still maintained at a low-level signal received in the pull-down phase H4 (for details, reference may be made to the following description of the pull-down phase H4) of the previous scanning period, to make the fifth TFT M5 be maintained in the off state.

Since in the pull-down phase H4 of the previous scanning period (for details, reference may be made to the following description of the pull-down phase H4), the pull-down node PD and the third capacitor C3 are charged, the signal at the pull-down node PD is a high-level signal, and the third capacitor C3 is fully charged. Therefore, in the pull-down holding phase H1 of the present scanning period, the signal at the pull-down node PD is still held at the high-level by means of the third capacitor C3. The eighth TFT M8 and the ninth TFT M9 are both controlled to be switched on when the signal at the pull-down node PD is the high-level signal, to enable the low-level signal from the first voltage terminal VGL to be transmitted to the output terminal Gn via the eighth TFT M8 and the ninth TFT M9. That is, in the pull-down holding phase H1, the output terminal Gn outputs the low-level signal.

In the pull-down holding phase H1, the signal at the pull-down node PD is the high-level signal. The pull-down node PD is coupled to the third TFT M3 and the fifth TFT M5. The third TFT M3 and the fifth TFT M5 can both be N-type indium gallium zinc oxide TFTs having the relatively low leakage current, to effectively prevent the signal at the pull-down node PD from being affected by the third TFT M3 and the fifth TFT M5, such that the signal at the pull-down node PD is stably maintained at the high level.

As illustrated in FIG. 3 and FIG. 5, in the pull-up phase H2, the control signal terminal Gn−1 receives an input of a second control signal of high-level, the clock signal terminal CLKn receives an input of a first clock signal of high-level, the signal from the first voltage terminal VGL is a low-level signal, and the signal from the second voltage terminal VGH is a high-level signal.

In this case, the fourth TFT M4 is controlled to be switched on, to enable the low-level signal from the first voltage terminal VGL to be transmitted to the gate of the third TFT M3 via the fourth TFT M4, so as to maintain the third TFT M3 to be in the off state.

The first TFT M1 is controlled to be switched on, to enable the high-level signal from the control signal terminal Gn−1 to be transmitted to the gate of the fifth TFT M5 via the first TFT M1, to make the fifth TFT M5 be switched on. Thereafter, the low-level signal from the first voltage terminal VGL is allowed to be transmitted to the gate of the eighth TFT M8 and the gate of the ninth TFT M9 via the fifth TFT M5, such that the signal at the pull-down node PD jumps from the high-level to a low-level, and the eighth TFT M8 and the ninth TFT M9 are controlled to be switched off.

The gate of the second TFT M2 is coupled to the second voltage terminal VGH, the second TFT M2 is controlled to be switched on, and therefore the high-level signal from the control signal terminal Gn−1 is allowed to be transmitted to the gate of the seventh TFT M7 via the first TFT M1 and the second TFT M2. In this case, the signal at the pull-up node PU jumps from the low-level to a high-level, such that the seventh TFT M7 is controlled to be switched on and the second capacitor C2 is charged. Thereafter, the high-level signal from the second voltage terminal VGH is allowed to be transmitted to the output terminal Gn via the seventh TFT M7. That is, in the pull-up phase H2, the output terminal Gn outputs the high-level signal.

In addition, since the first electrode of the seventh TFT M7 is coupled to the gate of the sixth TFT M6, the high-level signal from the second voltage terminal VGH is further allowed to be transmitted to the gate of the sixth TFT M6 via the seventh TFT M7, to control the sixth TFT M6 to be switched on. In this case, the high-level signal from the second voltage terminal VGH is transmitted to the first electrode of the ninth TFT M9 via the sixth TFT M6, to make the ninth TFT M9 be maintained in the off state to prevent the high-level signal (transmitted to the output terminal Gn via the seventh TFT M7) from leaking from the ninth TFT M9, thereby improving the stability of the high-level signal output from the output terminal Gn. In other words, the sixth TFT M6 is configured to make the output terminal Gn stably output the high-level signal, and avoid distortion of the high-level signal output from the output terminal Gn caused by that the voltage signal is pulled down by the ninth TFT M9.

Figure 6:
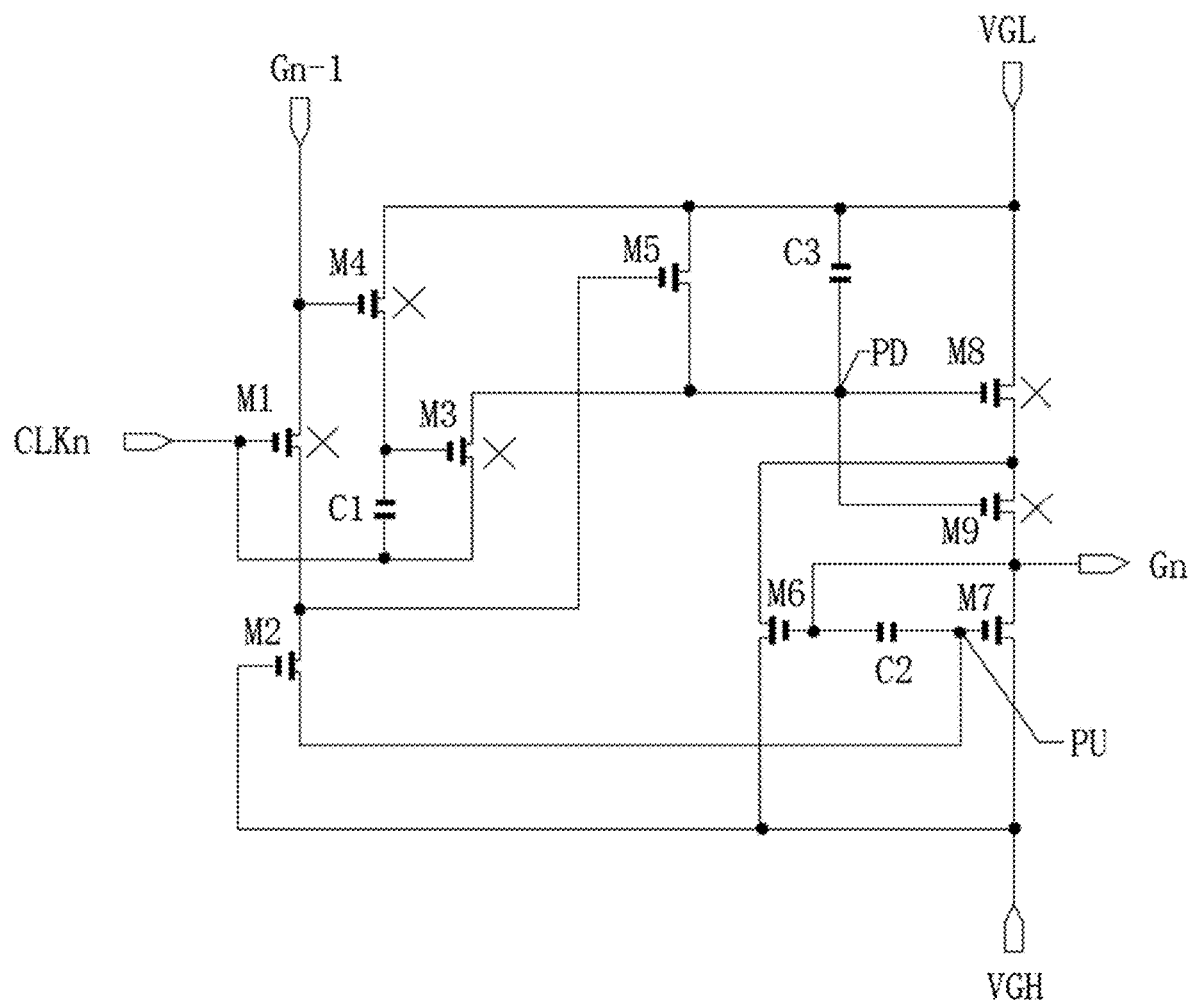
FIG. 6 is a schematic structural diagram illustrating a GOA circuit in a pull-up holding phase according to implementations of the disclosure.

As illustrated in FIG. 3 and FIG. 6, in the pull-up holding phase H3, the control signal terminal Gn−1 receives an input of a first control signal of low-level, the clock signal terminal CLKn receives an input of a second clock signal of low-level, the signal from the first voltage terminal VGL is a low-level signal, and the signal from the second voltage terminal VGH is a high-level signal.

In this case, the first TFT M1, the third TFT M3, and the fourth TFT M4 are controlled to be switched off, and the second TFT M2 is still in the on state. Since in the pull-up phase H2 the second capacitor C2 is fully charged, the signal at the pull-up node PU is still held at the high level by means of the second capacitor C2, that is, the signal at the gate of the seventh TFT M7 is a high-level signal. Therefore, the seventh TFT M7 is controlled to be switched on, and the high-level signal from the second voltage terminal VGH continues to be transmitted to the output terminal Gn via the seventh TFT M7. In other words, the sixth TFT M6 continues to maintain the stability of the high-level signal output from the output terminal Gn. That is, in the pull-up holding phase H3, the output terminal Gn outputs the high-level signal.

In addition, the high-level signal at the pull-up node PU is further allowed to be transmitted to the gate of the fifth TFT M5 via the second TFT M2, to make the fifth TFT M5 be switched on. The signal at the pull-down node PD is still in the low level, and the eighth TFT M8 and the ninth TFT M9 are still maintained in the off state.

In the pull-up holding phase H3, the second TFT M2 is coupled to the first TFT M1. If the leakage current of the first TFT M1 is relatively large, the voltage signal at the pull-up node PU may be pulled down, which causes the high-level signal at the pull-up node PU to be unstable and further causes the signal output from the output terminal Gn to be unstable. Therefore, in the implementation, the first TFT M1 can be an N-type indium gallium zinc oxide TFT having the relatively low leakage current, which can reduce the influence generated by the leakage current and make the output terminal Gn stably output signals.

As illustrated in FIG. 3 and FIG. 7, in the pull-down phase H4, the control signal terminal Gn−1 receives an input of a first control signal of low-level, the clock signal terminal CLKn receives an input of a first clock signal of high-level, the signal from the first voltage terminal VGL is a low-level signal, and the signal from the second voltage terminal VGH is a high-level signal.

In this case, the fourth TFT M4 is controlled to be switched off, and the first TFT M1 is controlled to be switched on, such that the low-level signal from the control signal terminal Gn−1 is allowed to be transmitted to the fifth TFT M5 and the seventh TFT M7 via the first TFT M1, to make the fifth TFT M5 and the seventh TFT M7 be switched off.

In addition, the high-level signal from the clock signal terminal CLKn is transmitted to the second end of the first capacitor C1 and the second electrode of the third TFT M3, and the signal from the first capacitor C1 jumps from the low-level to a high-level, such that the first capacitor C1 is switched on, and therefore the high-level signal from the clock signal terminal CLKn is allowed to be transmitted to the gate of the third TFT M3 coupled to the first end of the first capacitor C1, to make the third TFT M3 be switched on.

The high-level signal from the clock signal terminal CLKn is allowed to be transmitted to the pull-down node PD via the third TFT M3, such that the pull-down node PD and the third capacitor C3 can be charged and the eighth TFT M8 and the ninth TFT M9 are controlled to be switched on. Therefore, the low-level signal from the first voltage terminal VGL is allowed to be transmitted to the output terminal Gn via the eighth TFT M8 and the ninth TFT M9. That is, in the pull-down phase H4, the output terminal Gn outputs the low-level signal.

In the pull-down phase H4, when the leakage current of the fifth TFT M5 coupled to the pull-down node PD is relatively large, the voltage signal at the pull-down node PD may be pulled down, which may affect the stability of the voltage signal at the pull-down node PD, thereby causing distortion of the signal output from the output terminal Gn. Therefore, in the implementation, the fifth TFT M5 is an N-type indium gallium zinc oxide TFT having the relatively low leakage current to reduce the influence generated by the leakage current. In addition, when the leakage current of the fourth TFT M4 coupled to the first end of the first capacitor C1 is relatively large, the current of the first capacitor C1 may leak from the fourth TFT M4, which may cause that the gate of the third TFT M3 is unable to effectively receive the high-level signal, thereby causing the third TFT M3 to be switched off ahead of time. As a result, the voltage signal at the pull-down node PD jumps to the low level ahead of time, thereby causing the eighth TFT M8 and the ninth TFT M9 to be switched off ahead of time, and finally causing the signal output from the output terminal Gn to be ended ahead of time. Therefore, in the implementations, the fourth TFT M4 is an N-type indium gallium zinc oxide TFT having the relatively low leakage current, to further reduce the influence generated by the leakage current and make the output terminal Gn stably output signals.

Since the time of the pull-down phase H4 of the GOA circuit is relatively long, when the third TFT M3 and the fifth TFT M5 are both the N-type indium gallium zinc oxide TFTs having the relatively low leakage current, the influence of the leakage current on the signal output from the output terminal Gn can be effectively improved.

In another implementation, at least one of the first TFT M1, the third TFT M3, the fourth TFT M4, or the fifth TFT M5 can adopt the N-type indium gallium zinc oxide TFT, to reduce the influence generated by the leakage current.

Figure 8:
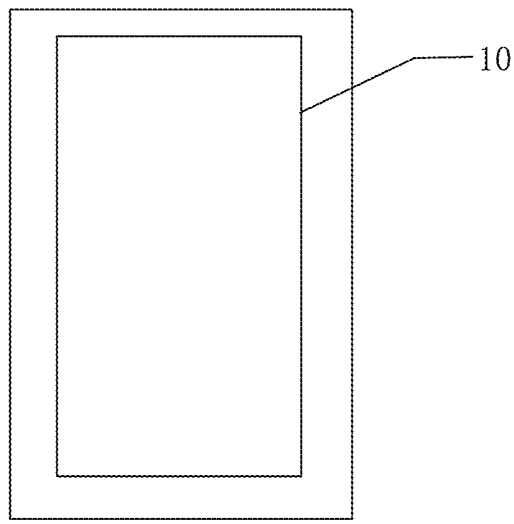
FIG. 8 is a schematic structural diagram illustrating a display panel according to implementations of the disclosure.

As illustrated in FIG. 8, a display panel 20 is provided according to an implementation of the disclosure. The display panel 20 includes the GOA circuit 10 described above. In at least one implementation, the refresh rate of the display panel 20 ranges from 1 Hz to 120 Hz. In one example, the refresh rate refers to a minimal period that the control signal repeats. According to implementations, the refresh rate may be a minimal period that the control signal from the control signal terminal repeats, or a minimal period that the clock signal from the clock signal terminal repeats. In the display panel (where the refresh rate of the display panel is dynamically changed within 1 Hz-120 Hz), the GOA circuit of the disclosure works stably, and the waveform the signal output from the GOA circuit is not affected when the refresh rate is dynamically changed. In one example, the refresh rate of the display panel 20 ranges from 1 Hz to 30 Hz, 30 Hz to 60 Hz, 30 Hz to 90 Hz, 90 Hz to 120 Hz, 1 Hz to 60 Hz, or 60 Hz to 120 Hz.

Figure 9:
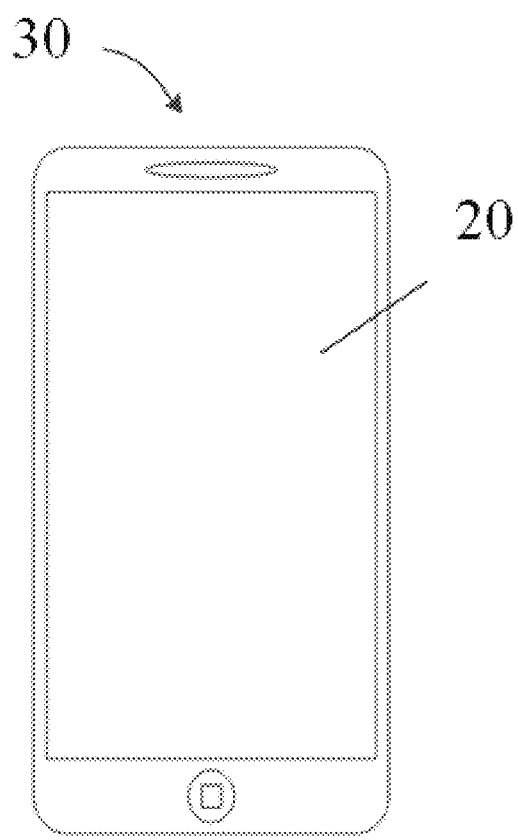
FIG. 9 is a schematic structural diagram illustrating an electronic device according to implementations of the disclosure.

As illustrated in FIG. 9, an electronic device 30 is further provided according to an implementation of the disclosure. The electronic device 30 includes the GOA circuit 10 described above or the display panel 20 described above. The electronic device 30 may be, but is not limited to, an e-book, a smart phone (such as an Android® phone, an iOS® phone, a Windows® phone, etc.), a tablet computer, a flexible handheld computer, a flexible notebook computer, a mobile internet device (MID), or a wearable device, etc., or may be an organic light-emitting diodes (OLED) electronic device, or an active matrix organic light emitting diode (AMOLED) electronic device.

The foregoing merely describes some implementations of the disclosure, and their description is relatively specific and detailed, but they should not be understood as a limitation to the patent scope of the disclosure. It should be noted that for those of ordinary skill in the art, various modifications and improvements can be made without departing from the concept of the disclosure, which all fall within the protection scope of the disclosure. Therefore, the protection scope of the disclosure should be subject to the appended claims.

What is claimed is:

1. A gate driver on array (GOA) circuit, comprising:
a plurality of cascaded GOA units, wherein each of the plurality of GOA units comprises a first pull-down control module, a second pull-down control module, and a pull-down holding module, and the GOA unit further comprises a first voltage terminal, a clock signal terminal, and a control signal terminal that are configured to provide signals, and a scanning period of the GOA unit comprises a pull-up phase and a pull-down phase,
the first pull-down control module is coupled to the clock signal terminal, and is configured to output a signal from the clock signal terminal to a pull-down node in the pull-down phase;
the second pull-down control module is coupled to the first voltage terminal, and is configured to output a signal from the first voltage terminal to the pull-down node in the pull-up phase;

the pull-down holding module is coupled to the first pull-down control module and the second pull-down control module, and is configured to output, in the pull-down phase, the signal from the first voltage terminal to an output terminal according to the signal at the pull-down node, and to stop outputting, in the pull-up phase, the signal from the first voltage terminal to the output terminal according to the signal at the pull-down node; and a type of at least one thin film transistor (TFT) in at least one of the first pull-down control module or the second pull-down control module is different from that of a TFT in the pull-down holding module, and the GOA unit further comprises a pull-up control module, a pull-up holding module, and a second voltage terminal, the pull-up control module is coupled to the control signal terminal, and is configured to output a signal from the control terminal to a pull-up node in the pull-up phase or the pull-down phase; and the pull-up holding module is coupled to the pull-up control module, and is configured to output, in the pull-up phase, a signal from the second voltage terminal to the output terminal according to the signal at the pull-up node, and to stop outputting, in the pull-down phase, the signal from the second voltage terminal to the output terminal according to the signal at the pull-up node.

2. The GOA circuit of claim 1, wherein the at least one TFT in at least one of the first pull-down control module or the second pull-down control module is an N-type metal oxide TFT.

3. The GOA circuit of claim 2, wherein a channel layer of the N-type metal oxide TFT is made from at least one material selected from a group consisting of indium gallium zinc oxide, gallium zinc oxide, indium zinc oxide, indium gallium tin oxide, and indium tin oxide.

4. The GOA circuit of claim 1, wherein the pull-up control module comprises a first TFT and a second TFT, the first TFT has a gate coupled to the clock signal terminal, a first electrode coupled to the control signal terminal, and a second electrode coupled to a first electrode of the second TFT;

the second TFT has a gate coupled to the second voltage terminal and a second electrode coupled to the pull-up node;

in the pull-up phase, the control signal terminal receives an input of a second control signal, and the clock signal terminal receives an input of a first clock signal, wherein the first clock signal is used for controlling the first TFT to be switched on, and the signal from the second voltage terminal is used for controlling the second TFT to be switched on, to enable the second control signal to be transmitted to the pull-up node via the first TFT and the second TFT; and in the pull-down phase, the control signal terminal receives an input of a first control signal, and the clock signal terminal receives the input of the first clock signal, wherein the first clock signal is used for controlling the first TFT to be switched on, and the signal from the second voltage terminal is used for controlling the second TFT to be switched on, to enable the first control signal to be transmitted to the pull-up node via the first TFT and the second TFT.

5. The GOA circuit of claim 4, wherein the first TFT is an N-type metal oxide TFT.

6. The GOA circuit of claim 4, wherein the first pull-down control module comprises a fourth TFT, a third TFT, and a first capacitor, the fourth TFT has a gate coupled to the control signal terminal, a first electrode coupled to the first voltage terminal, and a second electrode coupled to a first end of the first capacitor and a gate of the third TFT;

the first capacitor has a second end coupled to a second electrode of the third TFT and the clock signal terminal;

the third TFT has a first electrode coupled to the pull-down node; and in the pull-down phase, the control signal terminal receives the input of the first control signal, the clock signal terminal receives the input of the first clock signal, and the first control signal is configured to control the fourth TFT to be switched off, and the first capacitor transmits the first clock signal from the clock signal terminal to the gate of the third TFT to control the third TFT to be switched on, and transmits the first clock signal from the clock signal terminal to the pull-down node via the third TFT.

7. The GOA circuit of claim 6, wherein at least one of the fourth TFT or the third TFT is an N-type metal oxide TFT.

8. The GOA circuit of claim 6, wherein the second pull-down control module comprises a fifth TFT, the fifth TFT has a gate coupled to the control signal terminal, a first electrode coupled to the first voltage terminal, and a second electrode coupled to the pull-down node; and in the pull-up phase, the control signal terminal receives the input of the second control signal, and the fifth TFT is controlled to be switched on according to the second control signal from the control signal terminal, and transmits the signal from the first voltage terminal to the pull-down node.

9. The GOA circuit of claim 8, wherein the fifth TFT is an N-type metal oxide TFT.

10. The GOA circuit of claim 8, wherein the pull-up control module further comprises a sixth TFT, wherein the sixth TFT has a gate coupled to the output terminal, a first electrode coupled to the second voltage terminal, and a second electrode coupled to the pull-down holding module.

11. The GOA circuit of claim 10, wherein the pull-up holding module comprises a seventh TFT and a second capacitor, wherein the seventh TFT has a gate coupled to the pull-up node and a first end of the second capacitor, a first electrode coupled to the output terminal, and a second electrode coupled to the second voltage terminal;

the second capacitor has a second end coupled to the output terminal;

in the pull-up phase, the signal at the pull-up node is used for controlling the seventh TFT to be switched on, to enable the signal from the second voltage terminal to be transmitted to the output terminal via the seventh TFT; and in the pull-down phase, the signal at the pull-up node is used for controlling the seventh TFT to be switched off, to disenable the signal from the second voltage terminal to be transmitted to the output terminal.

12. The GOA circuit of claim 11, wherein
the seventh TFT is an N-type TFT, and the seventh TFT is in an on state when the signal at the pull-up node is a high-level signal, to transmit the signal from the second voltage terminal to the output terminal; or
the seventh TFT is a P-type TFT, and the seventh TFT is in an on state when the signal at the pull-up node is a low-level signal, to transmit the signal from the second voltage terminal to the output terminal.

13. The GOA circuit of claim 11, wherein
the pull-down holding module comprises an eighth TFT, a ninth TFT, and a third capacitor, and the pull-down node is coupled to a gate of the eighth TFT, a gate of the ninth TFT, and a second end of the third capacitor, and the eighth TFT has a first electrode coupled to the first voltage terminal and a second electrode coupled to a first electrode of the ninth TFT, and the ninth TFT has a second electrode coupled to the output terminal, and the third capacitor has a first end coupled to the first voltage terminal;
in the pull-down phase, the signal at the pull-down node is used for controlling the eighth TFT and the ninth TFT to be switched on, to enable the signal from the first voltage terminal to be transmitted to the output terminal via the eighth TFT and the ninth TFT; and
in the pull-up phase, the signal at the pull-down node is used for controlling the eighth TFT and the ninth TFT to be switched off, to disenable the signal from the first voltage terminal to be transmitted to the output terminal.

14. The GOA circuit of claim 13, wherein
the eighth TFT and the ninth TFT are both N-type TFTs, and the eighth TFT and the ninth TFT are both in an on state when the signal at the pull-down node is a high-level signal, to transmit the signal from the first voltage terminal to the output terminal; or
the eighth TFT and the ninth TFT are both P-type TFTs, and the eighth TFT and the ninth TFT are both in an on state when the signal at the pull-down node is a low-level signal, to transmit the signal from the first voltage terminal to the output terminal.

15. The GOA circuit of claim 1, wherein the output terminal of the GOA circuit continuously outputs signals, and a refresh rate of the GOA circuit is dynamically changed when a frequency of a signal from the control signal terminal is changed.

16. The GOA circuit of claim 1, wherein a refresh rate of the GOA circuit ranges from 1 Hz to 120 Hz.

17. The GOA circuit of claim 1, wherein a leakage current of the at least one TFT in at least one of the first pull-down control module or the second pull-down control module is less than $10^{-12}$ A.

18. A display panel comprising a GOA circuit, wherein the GOA circuit comprises:
a plurality of cascaded GOA units, wherein each of the plurality of GOA units comprises a first pull-down control module, a second pull-down control module, and a pull-down holding module, and the GOA unit further comprises a first voltage terminal, a clock signal terminal, and a control signal terminal that are configured to provide signals, and a scanning period of the GOA unit comprises a pull-up phase and a pull-down phase,
the first pull-down control module is coupled to the clock signal terminal, and is configured to output a signal from the clock signal terminal to a pull-down node in the pull-down phase;
the second pull-down control module is coupled to the first voltage terminal, and is configured to output a signal from the first voltage terminal to the pull-down node in the pull-up phase;
the pull-down holding module is coupled to the first pull-down control module and the second pull-down control module, and is configured to output, in the pull-down phase, the signal from the first voltage terminal to an output terminal according to the signal at the pull-down node, and to stop outputting, in the pull-up phase, the signal from the first voltage terminal to the output terminal according to the signal at the pull-down node; and
a type of at least one thin film transistor (TFT) in at least one of the first pull-down control module or the second pull-down control module is different from that of a TFT in the pull-down holding module, and
the GOA unit further comprises a pull-up control module, a pull-up holding module, and a second voltage terminal,
the pull-up control module is coupled to the control signal terminal, and is configured to output a signal from the control signal terminal to a pull-up node in the pull-up phase or the pull-down phase; and
the pull-up holding module is coupled to the pull-up control module, and is configured to output, in the pull-up phase, a signal from the second voltage terminal to the output terminal according to the signal at the pull-up node, and to stop outputting, in the pull-down phase, the signal from the second voltage terminal to the output terminal according to the signal at the pull-up node.

19. An electronic device comprising a display panel, wherein the display panel comprises a GOA circuit, wherein the GOA circuit comprises:
a plurality of cascaded GOA units, wherein each of the plurality of GOA units comprises a first pull-down control module, a second pull-down control module, and a pull-down holding module, and the GOA unit further comprises a first voltage terminal, a clock signal terminal, and a control signal terminal that are configured to provide signals, and a scanning period of the GOA unit comprises a pull-up phase and a pull-down phase,
the first pull-down control module is coupled to the clock signal terminal, and is configured to output a signal from the clock signal terminal to a pull-down node in the pull-down phase;
the second pull-down control module is coupled to the first voltage terminal, and is configured to output a signal from the first voltage terminal to the pull-down node in the pull-up phase;
the pull-down holding module is coupled to the first pull-down control module and the second pull-down control module, and is configured to output, in the pull-down phase, the signal from the first voltage terminal to an output terminal according to the signal at the pull-down node, and to stop outputting, in the pull-up phase, the signal from the first voltage terminal to the output terminal according to the signal at the pull-down node; and
a type of at least one thin film transistor (TFT) in at least one of the first pull-down control module or the second pull-down control module is different from that of a TFT in the pull-down holding module, and
the GOA unit further comprises a pull-up control module, a pull-up holding module, and a second voltage terminal,
the pull-up control module is coupled to the control signal terminal, and is configured to output a signal from the control signal terminal to a pull-up node in the pull-up phase or the pull-down phase; and
the pull-up holding module is coupled to the pull-up control module, and is configured to output, in the pull-up phase, a signal from the second voltage terminal to the output terminal according to the signal at the pull-up node, and to stop outputting, in the pull-down phase, the signal from the second voltage terminal to the output terminal according to the signal at the pull-up node.

* * * * *